United States Patent
Kajiwara

(10) Patent No.: US 7,711,042 B2
(45) Date of Patent: May 4, 2010

(54) SIGNAL PROCESSING DEVICE AND METHOD, AND SIGNAL DECODING DEVICE AND METHOD

(75) Inventor: Yoshiyuki Kajiwara, Kanagawa (JP)

(73) Assignee: Sony Corporation, Tokyo (JP)

( * ) Notice: Subject to any disclaimer, the term of this patent is extended or adjusted under 35 U.S.C. 154(b) by 1036 days.

(21) Appl. No.: 10/555,096

(22) PCT Filed: Mar. 24, 2005

(86) PCT No.: PCT/JP2005/005371

§ 371 (c)(1),
(2), (4) Date: Nov. 2, 2005

(87) PCT Pub. No.: WO2005/099092

PCT Pub. Date: Oct. 20, 2005

(65) Prior Publication Data

US 2007/0036211 A1 Feb. 15, 2007

(30) Foreign Application Priority Data

Apr. 6, 2004 (JP) .............................. 2004-112318

(51) Int. Cl.
*H03K 5/159* (2006.01)
(52) U.S. Cl. ........................ 375/232; 375/229; 375/230; 375/231; 375/233; 375/234; 375/235; 375/236; 375/316; 375/324
(58) Field of Classification Search .......... 375/229–233

See application file for complete search history.

(56) References Cited

U.S. PATENT DOCUMENTS

| 5,422,805 A | * | 6/1995 | McIntyre et al. | ............ 708/625 |
| 5,471,504 A | * | 11/1995 | Lee et al. | ..................... 375/233 |
| 6,449,110 B1 | * | 9/2002 | DeGroat et al. | ............... 360/46 |
| 6,600,794 B1 | * | 7/2003 | Agarossi et al. | ............. 375/341 |

(Continued)

FOREIGN PATENT DOCUMENTS

JP 2001-525101 12/2001

OTHER PUBLICATIONS

Fermo et al. "Simplified Volterra Filters for Acoustic Echo Cancellation in GSM receivers", Sep. 2000.*

(Continued)

*Primary Examiner*—Mohammad H Ghayour
*Assistant Examiner*—Sophia Vlahos
(74) *Attorney, Agent, or Firm*—Oblon, Spivak, McClelland, Maier & Neustadt, L.L.P.

(57) ABSTRACT

A second-order Volterra filter has a quadratic section including a plurality of multiplication units that multiply a first input signal with a second input signal. One of the multiplication units employs a signal not delayed from the first input signal, as the second input signal. A remaining one of the multiplication units employs a signal delayed a preset time from the first input signal, as the second input signal. The one of the multiplication units includes a multiplier that multiplies the signal output from the one of the multiplication units and a signal output from each of one or more delay units, each with a preset coefficient. A step gain parameter for updating each preset coefficient of a multiplier of the remaining one of the multiplication units is twice a step gain parameter for updating each preset coefficient of the multiplier of the one of the multiplication units.

9 Claims, 17 Drawing Sheets

U.S. PATENT DOCUMENTS 7,012,722 B2 * 3/2006 Ogasawara ............... 359/30
7,012,772 B1 * 3/2006 Vis ........................ 360/46

OTHER PUBLICATIONS

N. B. Jones et al. "Digital Signal Processing", IEE Control Engineering Series 42, Jan. 1990, p. 86.*

George-Othon A. Glentis et al., "Efficient Algorithms for Volterra System Identification", IEEE Transactions on Signal Processing, vol. 47, No. 11, pp. 3042-3057, Nov. 1999.

V. John Mathews: "Adaptive Polynomial Filters", Signal Processing Magazine, Beikoku, IEEE, vol. 8, No. 3, pp. 10-26, Jul. 1991.

Mounir Sayadi, et al., "A Fast M-D Chandrasekhar Algorithm for Second Order Volterra Adaptive Filtering" IEEE International Conference on Acoustics, Speech, and Signal Processing, vol. 3, May 1996, pp. 1339-1342.

Ching-Hsiang Tseng, "A mixed-domain method for identification of quadratically nonlinear systems", IEEE Transactions on Signal Processing, IEEE, vol. 45, No. 4, pp. 1013-1024, Apr. 1997.

* cited by examiner

|   | $i_2$ 0 | 1 | 2 | 3 | 4 | 5 |
|---|---|---|---|---|---|---|
| $i_1$ | | | | | | |
| 0 | $x^{(2)}(k,0,0)$ | $x^{(2)}(k,0,1)$ | $x^{(2)}(k,0,2)$ | $x^{(2)}(k,0,3)$ | $x^{(2)}(k,0,4)$ | $x^{(2)}(k,0,5)$ |
| 1 | $x^{(2)}(k,1,0)$ | $x^{(2)}(k,1,1)$ | $x^{(2)}(k,1,2)$ | $x^{(2)}(k,1,3)$ | $x^{(2)}(k,1,4)$ | $x^{(2)}(k,1,5)$ |
| 2 | $x^{(2)}(k,2,0)$ | $x^{(2)}(k,2,1)$ | $x^{(2)}(k,2,2)$ | $x^{(2)}(k,2,3)$ | $x^{(2)}(k,2,4)$ | $x^{(2)}(k,2,5)$ |
| 3 | $x^{(2)}(k,3,0)$ | $x^{(2)}(k,3,1)$ | $x^{(2)}(k,3,2)$ | $x^{(2)}(k,3,3)$ | $x^{(2)}(k,3,4)$ | $x^{(2)}(k,3,5)$ |
| 4 | $x^{(2)}(k,4,0)$ | $x^{(2)}(k,4,1)$ | $x^{(2)}(k,4,2)$ | $x^{(2)}(k,4,3)$ | $x^{(2)}(k,4,4)$ | $x^{(2)}(k,4,5)$ |
| 5 | $x^{(2)}(k,5,0)$ | $x^{(2)}(k,5,1)$ | $x^{(2)}(k,5,2)$ | $x^{(2)}(k,5,3)$ | $x^{(2)}(k,5,4)$ | $x^{(2)}(k,5,5)$ |

FIG. 1

| $i_1$ \ $i_2$ | 0 | 1 | 2 | 3 | 4 | 5 |
|---|---|---|---|---|---|---|
| 0 | $h^{(2)}(0,0)$ | $h^{(2)}(0,1)$ | $h^{(2)}(0,2)$ | $h^{(2)}(0,3)$ | $h^{(2)}(0,4)$ | $h^{(2)}(0,5)$ |
| 1 | $h^{(2)}(1,0)$ | $h^{(2)}(1,1)$ | $h^{(2)}(1,2)$ | $h^{(2)}(1,3)$ | $h^{(2)}(1,4)$ | $h^{(2)}(1,5)$ |
| 2 | $h^{(2)}(2,0)$ | $h^{(2)}(2,1)$ | $h^{(2)}(2,2)$ | $h^{(2)}(2,3)$ | $h^{(2)}(2,4)$ | $h^{(2)}(2,5)$ |
| 3 | $h^{(2)}(3,0)$ | $h^{(2)}(3,1)$ | $h^{(2)}(3,2)$ | $h^{(2)}(3,3)$ | $h^{(2)}(3,4)$ | $h^{(2)}(3,5)$ |
| 4 | $h^{(2)}(4,0)$ | $h^{(2)}(4,1)$ | $h^{(2)}(4,2)$ | $h^{(2)}(4,3)$ | $h^{(2)}(4,4)$ | $h^{(2)}(4,5)$ |
| 5 | $h^{(2)}(5,0)$ | $h^{(2)}(5,1)$ | $h^{(2)}(5,2)$ | $h^{(2)}(5,3)$ | $h^{(2)}(5,4)$ | $h^{(2)}(5,5)$ |

FIG.2

|    | i₂ |   |   |   |   |   |
|----|----|---|---|---|---|---|
| i₁ | 0  | 1 | 2 | 3 | 4 | 5 |
| 0 | $x^{(2)}(k,0,0)$ | | | | | |
| 1 | | $x^{(2)}(k,1,1)$ | | | | |
| 2 | | | $x^{(2)}(k,2,2)$ | | | |
| 3 | | | | $x^{(2)}(k,3,3)$ | | |
| 4 | | | | | $x^{(2)}(k,4,4)$ | |
| 5 | | | | | | $x^{(2)}(k,5,5)$ |

FIG.3

|  | x (k,0,1) | x (k,0,2) | x (k,0,3) | x (k,0,4) | x (k,0,5) |
|---|---|---|---|---|---|
|  |  | x (k,1,2) | x (k,1,3) | x (k,1,4) | x (k,1,5) |
|  |  |  | x (k,2,3) | x (k,2,4) | x (k,2,5) |
|  |  |  |  | x (k,3,4) | x (k,3,5) |
|  |  |  |  |  | x (k,4,5) |
|  |  |  |  |  |  |

FIG.4

| $i_1$ \ $i_2$ | 0 | 1 | 2 | 3 | 4 | 5 |
|---|---|---|---|---|---|---|
| 0 | $W^{(2)}(k,0,0)$ | $W^{(2)}(k,0,1)$ | $W^{(2)}(k,0,2)$ | $W^{(2)}(k,0,3)$ | $W^{(2)}(k,0,4)$ | $W^{(2)}(k,0,5)$ |
| 1 | 0 | $W^{(2)}(k,1,1)$ | $W^{(2)}(k,1,2)$ | $W^{(2)}(k,1,3)$ | $W^{(2)}(k,1,4)$ | $W^{(2)}(k,1,5)$ |
| 2 | 0 | 0 | $W^{(2)}(k,2,2)$ | $W^{(2)}(k,2,3)$ | $W^{(2)}(k,2,4)$ | $W^{(2)}(k,2,5)$ |
| 3 | 0 | 0 | 0 | $W^{(2)}(k,3,3)$ | $W^{(2)}(k,3,4)$ | $W^{(2)}(k,3,5)$ |
| 4 | 0 | 0 | 0 | 0 | $W^{(2)}(k,4,4)$ | $W^{(2)}(k,4,5)$ |
| 5 | 0 | 0 | 0 | 0 | 0 | $W^{(2)}(k,5,5)$ |

FIG.5

| $i_1$ \ $i_2$ | 0 | 1 | 2 | 3 | 4 | 5 |
|---|---|---|---|---|---|---|
| 0 | $x^{(2)}(k,0,0)$ | $2x^{(2)}(k,0,1)$ | $2x^{(2)}(k,0,2)$ | $2x^{(2)}(k,0,3)$ | $2x^{(2)}(k,0,4)$ | $2x^{(2)}(k,0,5)$ |
| 1 | 0 | $x^{(2)}(k,1,1)$ | $2x^{(2)}(k,1,2)$ | $2x^{(2)}(k,1,3)$ | $2x^{(2)}(k,1,4)$ | $2x^{(2)}(k,1,5)$ |
| 2 | 0 | 0 | $x^{(2)}(k,2,2)$ | $2x^{(2)}(k,2,3)$ | $2x^{(2)}(k,2,4)$ | $2x^{(2)}(k,2,5)$ |
| 3 | 0 | 0 | 0 | $x^{(2)}(k,3,3)$ | $2x^{(2)}(k,3,4)$ | $2x^{(2)}(k,3,5)$ |
| 4 | 0 | 0 | 0 | 0 | $x^{(2)}(k,4,4)$ | $2x^{(2)}(k,4,5)$ |
| 5 | 0 | 0 | 0 | 0 | 0 | $x^{(2)}(k,5,5)$ |

FIG.6

| $i_1$ \ $i_2$ | 0 | 1 | 2 | 3 | 4 | 5 |
|---|---|---|---|---|---|---|
| 0 | $W^{(2)}(k,0,0)$ | $W^{(2)}(k,0,1)$ | $W^{(2)}(k,0,2)$ | $W^{(2)}(k,0,3)$ | $W^{(2)}(k,0,4)$ | $W^{(2)}(k,0,5)$ |
| 1 | 0 | $W^{(2)}(k-1,0,0)$ | $W^{(2)}(k-1,0,1)$ | $W^{(2)}(k-1,0,2)$ | $W^{(2)}(k-1,0,3)$ | $W^{(2)}(k-1,0,4)$ |
| 2 | 0 | 0 | $W^{(2)}(k-2,0,0)$ | $W^{(2)}(k-2,0,1)$ | $W^{(2)}(k-2,0,2)$ | $W^{(2)}(k-2,0,3)$ |
| 3 | 0 | 0 | 0 | $W^{(2)}(k-3,0,0)$ | $W^{(2)}(k-3,0,1)$ | $W^{(2)}(k-3,0,2)$ |
| 4 | 0 | 0 | 0 | 0 | $W^{(2)}(k-4,0,0)$ | $W^{(2)}(k-4,0,1)$ |
| 5 | 0 | 0 | 0 | 0 | 0 | $W^{(2)}(k-5,0,0)$ |

FIG.7

| $i_1$ \ $i_2$ | 0 | 1 | 2 | 3 | 4 | 5 |
|---|---|---|---|---|---|---|
| 0 | $x^{(2)}(k,0,0)$ | $2x^{(2)}(k,0,1)$ | $2x^{(2)}(k,0,2)$ | $2x^{(2)}(k,0,3)$ | $2x^{(2)}(k,0,4)$ | $2x^{(2)}(k,0,5)$ |
| 1 | 0 | $x^{(2)}(k-1,0,0)$ | $2x^{(2)}(k-1,0,1)$ | $2x^{(2)}(k-1,0,2)$ | $2x^{(2)}(k-1,0,3)$ | $2x^{(2)}(k-1,0,4)$ |
| 2 | 0 | 0 | $x^{(2)}(k-2,0,0)$ | $2x^{(2)}(k-2,0,1)$ | $2x^{(2)}(k-2,0,2)$ | $2x^{(2)}(k-2,0,3)$ |
| 3 | 0 | 0 | 0 | $x^{(2)}(k-3,0,0)$ | $2x^{(2)}(k-3,0,1)$ | $2x^{(2)}(k-3,0,2)$ |
| 4 | 0 | 0 | 0 | 0 | $x^{(2)}(k-4,0,0)$ | $2x^{(2)}(k-4,0,1)$ |
| 5 | 0 | 0 | 0 | 0 | 0 | $x^{(2)}(k-5,0,0)$ |

FIG.8

SIGNAL PROCESSING DEVICE AND METHOD, AND SIGNAL DECODING DEVICE AND METHOD

TECHNICAL FIELD

This invention relates to an apparatus and a method for signal processing for implementing a quadratic term of a second-order Volterra filter for non-linear equalization of an input signal presenting non-linear distortion, and an apparatus and a method for decoding signals having or employing such apparatus or method for signal processing.

The present invention contains subject matter related to Japanese Patent Application JP 2004-112318 filed in the Japanese Patent Office on Apr. 6, 2004, the entire contents of which are incorporated herein by reference.

BACKGROUND ART

The storage device exploiting the magnetic recording technique or the optical recording technique, or the signal processing apparatus employed in a wireless communication apparatus, as well as the software algorithm, used therefor, is designed on the basis of a linear signal processing theory based on the assumed linear performance of input signals. In general, these input signals are not formed only of perfectly linear signal components, and also contain non-linear components. However, these non-linear components are usually sufficiently low in power and therefore may be approximated to linear signals. For this reason, the signal processing apparatus, based on the linearity theory, has so far been used sufficiently efficaciously.

However, with recent development in the storage technology and increase in the recording density, non-linear properties presented in the reproduced signals have become non-negligible. These non-linear properties account for deterioration in the performance of a phase locked loop (PLL), in the convergence properties of an adaptive equalizing filter or in the ultimate data error rate. Even though attempts have so far been made in increasing the recording density of a recording medium for further improving its recording capacity, non-linear signal distortion, caused by the use of a recording medium having a high recording capacity, or by the use of a detector exhibiting a high detection sensitivity but presenting a non-linear response to input or output signals, proves a significant factor deterrent to further performance improvement of the entire apparatus.

Representative of the causes of these non-linear distortions of the reproduced signals are non-linear properties ascribable to the signal reproducing side and those ascribable to the recording medium. Among the representative causes of the former type, there are a non-linear response and a base line shift of magnetic field-voltage transducing characteristics of an MR (Magneto Resistive) head, used as a reproducing head for magnetic recording, and also a non-linear response of a photodetector used for optical recording. Among the representative causes of the latter type, there are non-linear inter-symbol interference (NLISI) under the state of high recording density of both the magnetic recording medium and the optical recording medium, and vertical signal asymmetry, brought about by the non-linear performance of the reflectivity of the recording medium in the course of optical recording.

The causes for ultimate deterioration in the error rate will now be scrutinized further.

In a linear adaptive equalizing filter, employing an LMS (Least Mean Square) algorithm, as mounted on a customary signal processing apparatus, convergence to tap coefficients, which will give the smallest square error value, is assured by detecting an error signal between a target detection value conforming to a preset equalization system, represented by partial response (PR), and an actually detected signal, as long as an input signal is free of non-linear distortion. However, with the above filter, the non-linear distortion, represented by vertical asymmetry, cannot be corrected, because of its theoretical structure.

It is noted that, with the linear adaptive equalizing filter, in which, due to its algorithm, the tap coefficient which will simply minimize the square error obtained is searched, there unavoidably persists the probability of convergence of the tap coefficients to values different from the ideal values of convergence. This indicates the possibility of producing unforeseen new equalization errors, that is, non-linear equalization errors, due to the fact that, in case an input signal to a linear adaptive equalizing filter suffers from non-linear distortion, resort is had to an adaptive equalizing algorithm in which correction of such non-linear equalization error is intrinsically not presupposed. Such non-linear equalization error leads to deterioration in the ultimate data error rate.

In this consideration, such a technique implementing a polynominal filter as an adaptive equalization filter has been proposed as a method for non-linear equalization of a signal exhibiting non-linear distortion (for example, see Patent Publications 1 and 2). Researches into such polynominal filter, generally termed a Volterra filter, have so far been attempted in a variety of technological fields. With the Volterra filter, it is possible to update the tap coefficients in accordance with an adaptive equalization algorithm, such as LMS or RLS (Recursive Least Square) algorithm, by way of optimization insofar as the least square error is concerned. Detailed explanation on an adaptive equalization Volterra filter may be found in a reference material entitled "Adaptive Polynominal Filters" by V. John Matthews, IEEE SP Magazine, July 1991, pp. 10 to 26.

Meanwhile, a customary second-order Volterra filter is represented by the following equation (1):

$$y(k) = \sum_{i=0}^{M_1-1} h^{(1)}(i) \cdot x(k-i) + \sum_{i_1=0}^{M_2-1} \sum_{i_2=0}^{M_2-1} h^{(2)}(i_1, i_2) \cdot x(k-i_1) \cdot x(k-i_2). \quad (1)$$

In this equation (1), $M_1$ denotes a tap length of a linear section, and $M_2$ denotes a tap length of a quadratic section. Moreover, in this equation, y(k) denotes an output signal of the second-order Volterra filter, at time k, x(k) is an input signal to the second-order Volterra filter, at time k, $h^{(1)}(i)$ denotes tap coefficients of the linear section, where i=0, 1, ..., $M_1-1$ and $h^{(2)}(i_1, i_2)$ denotes tap coefficients of the quadratic section ($i_1=0, 1, ..., M_2-1$; $i_2=0, 1, ..., M_2-1$).

Meanwhile, the second-order Volterra filter can be mounted so that the number of filter taps will sequentially be optimized in accordance with an adaptive equalization algorithm. In addition, if the optimum values of the tap coefficients of the linear and quadratic sections of the second-order Volterra filter are known from the outset, the second-order Volterra filter may also be mounted as a filter of fixed tap coefficients.

For completing calculations of the right side of the equation (1) by one cycle for the input signal x(k), $M_1$ multiplication operations and $2 \times M_2 \times M_2$ multiplication operations are needed for the first and second terms of the right side, respectively. Moreover, a number of delay lines for holding the input signals x(k) for the quadratic section, corresponding to $M_2$ clocks, are also needed in addition to the input signal delay line to the linear section of the filter By exploiting known symmetry of the second-order Volterra filter, the tap coefficients of the quadratic section of the filter satisfy the relationship indicated by the following equation (2):

$$h^{(2)}(i_1, i_2) = h^{(2)}(i_2, i_1) \quad (2)$$

By exploiting the relationship of this equation (2), the above equation (1) may be simplified to $$y(k) = \sum_{i=0}^{M_1-1} h^{(1)}(i) \cdot x(k-i) + \sum_{i=0}^{M_2-1} h^{(2)}(i,i) \cdot x^2(k-i) + 2 \sum_{i_1=0}^{M_2-1} \sum_{i_2 > i_1}^{M_2-1} h^{(2)}(i_1, i_2) \cdot x(k-i_1) \cdot x(k-i_2). \quad (3)$$

It is noted that $M_1$ multiplication operations, $2 \times M_2$ multiplication operations and $M_2 \times (M_2-1)$ multiplication operations are needed for the first, second and third terms of the right side of the equation (3), respectively.

The results of comparison of the number of the multipliers of the quadratic section of the second-order Volterra filter, indicated by the equations (1) and (3), for variable numbers $M_2$, are shown in FIG. 17 and in the following Table 1:

TABLE 1

| M2 | Number of multipliers of quadratic term of equation (1) | Number of multipliers of quadratic term of equation (2) |
|---|---|---|
| 1 | 2 | 2 |
| 2 | 8 | 6 |
| 3 | 18 | 12 |
| 4 | 32 | 20 |
| 5 | 50 | 30 |
| 6 | 72 | 42 |
| 7 | 98 | 56 |
| 8 | 128 | 72 |
| 9 | 162 | 90 |
| 10 | 200 | 110 |
| 11 | 242 | 132 |
| 12 | 288 | 156 |
| 13 | 338 | 182 |
| 14 | 392 | 210 |
| 15 | 450 | 240 |

As may be seen from FIG. 17 and Table 1, the larger the value of $M_2$, the more outstanding is the effect of reducing the number of the multipliers by the equation (3). However, even with the configuration of the equation (3), as many as 240 multipliers are needed for the case of M2=15.

That is, even though the higher order Volterra filter is highly efficacious for equalizing an input signal exhibiting non-linear distortion, many multiplication operations are needed if the filter is to be implemented by hardware or software, thus presenting implementation difficulties because of cost.

DISCLOSURE OF THE INVENTION

In view of the above-depicted problems of the prior art, it is an object of the present invention to provide an apparatus and a method for signal processing for appreciably reducing the number of multiplication operations in equalizing the input signal presenting non-linear distortion, and an apparatus and a method for decoding a signal provided with the signal processing apparatus.

A signal processing apparatus according to the present invention is a signal processing apparatus employing a second-order Volterra filter for an equalizer configured to equalize an input signal, wherein a quadratic section of the second-order Volterra filter for implementing a quadratic term of the second-order Volterra filter includes multiplication means for multiplying a first input signal and a second input signal together. The multiplication means includes one or more delay means connected in series with one another for delaying a signal output from the multiplication means, each by unit time, coefficient multiplying means for multiplying a signal output from the multiplication means and a signal output from each of the delay means, each with a preset coefficient, and summation means for summing outputs of the coefficient multiplying means together.

A signal processing method according to the present invention employs a second-order Volterra filter for equalizing an input signal. The processing equivalent to a quadratic term of the second-order Volterra filter includes a multiplication step of multiplying the first signal with the second signal, a delaying step of delaying a signal, output by the multiplication step, by one or more series-connected delay means, each by a unit time, a coefficient multiplying step of multiplying a signal output by the multiplication step and a signal output from each of the delaying step, with a preset coefficient, and a summing step of summing plural outputs of the coefficient multiplying step together.

With the apparatus and method for signal processing, an input signal exhibiting non-linear distortion is equalized, using the second-order Volterra filter. The multiplication processing, needed in the quadratic section of the second-order Volterra filter, may be curtailed significantly.

A signal decoding apparatus according to the present invention employs a second-order Volterra filter as an equalizer for equalizing and decoding an input signal. The signal decoding apparatus comprises a linear section of the second-order Volterra filter for implementing a linear term of the second-order Volterra filter and for linear equalization of the input signal, a quadratic section of the second-order Volterra filter for implementing a quadratic term of the second-order Volterra filter and for non-linear equalization of the input signal, signal summing means for summing a signal output from the linear section and a signal output from the quadratic section, and most likelihood decoding means for most likelihood decoding a signal output from the signal summing means. The quadratic section includes multiplication means for multiplying a first input signal with a second input signal. The multiplication means includes one or more series-connected delaying means for delaying signals output from the multiplication means, each by a preset time, coefficient multiplying means for multiplying a signal output from the multiplication means with a signal output from each of the delaying means, and summing means for summing outputs of the coefficient multiplying means together.

A signal decoding method according to the present invention employs a second-order Volterra filter in equalizing and decoding an input signal. The signal decoding method comprises a linear filtering step of implementing the processing equivalent to a linear term of the second-order Volterra filter and linear equalizing the input signal, a quadratic filtering step of implementing a quadratic term of the second-order Volterra filter and non-linear equalizing the input signal, a signal summing step of summing a signal output from the linear filtering step and a signal output from the quadratic filtering step together, and a most likelihood decoding step of most likelihood decoding a signal output from the signal summing step. The quadratic filtering step includes a multiplication step of multiplying the first input signal with the second input signal, a delaying step of delaying a signal, output by the multiplication step, by one or more series-connected delay means, each by a unit time, a coefficient multiplying step of multiplying a signal output by the multiplication step and a signal output from each of the delaying step, each with a preset coefficient, and a summing step of summing outputs of the coefficient multiplying step together.

The apparatus and the method for signal decoding equalize and decode an input signal by the second-order Volterra filter, and each include, in addition to a linear section, implementing the linear term of the second-order Volterra filter, a quadratic section implementing the quadratic term of the second-order Volterra filter and which significantly curtails the multiplication operations.

With the signal processing method and apparatus, according to the present invention, the multiplication processing, needed in equalizing the input signal by the quadratic section of the second-order Volterra filter, implementing the quadratic term of the second-order Volterra filter, may be reduced appreciably, thus enabling the reduction in the circuit scale in implementing the quadratic filter using an LSI (Large-Scale Integrated Circuit), while also enabling the reduction in the processing volume in implementing the quadratic filter using a DSP (Digital Signal Processor) and the software.

With the signal decoding apparatus and method according to the present invention, a quadratic filter, implementing the quadratic term of the second-order Volterra filter, and which is capable of significantly reducing the multiplication operations, is used for equalizing and decoding the input signal by the second-order Volterra filter, in addition to the linear section implementing the linear term of the second-order Volterra filter, thus effectively correcting the non-linear distortion by a smaller volume of multiplication operations.

Other objects and advantages of the present invention will become more apparent from the preferred embodiments thereof especially when read in conjunction with the drawings.

BRIEF DESCRIPTION OF THE DRAWINGS

FIG. 1 is a diagrammatic view showing a two-dimensional array $x^{(2)}(k, i_1, i_2)$ for $M_2=6$.

FIG. 2 is a diagrammatic view showing a two-dimensional array $h^{(2)}(i_1, i_2)$ for $M_2=6$.

FIG. 3 shows elements of a diagonal term $x^{(2)}(k, i, i)$ in the two-dimensional array shown in FIG. 1.

FIG. 4 shows elements of a non-diagonal term $x^{(2)}(k, i_1, i_2)$ in the two-dimensional array shown in FIG. 1.

FIG. 5 is a diagrammatic view showing a two-dimensional array $W^{(2)}(k, i_1, i_2)$ for $M_2=6$.

FIG. 6 is a diagrammatic view representing the contents of respective elements of the two-dimensional array $W^{(2)}(k, i_1, i_2)$ shown in FIG. 5, using $x^{(2)}(k, i_1, i_2)$.

FIG. 7 shows the contents of the respective elements of the two-dimensional array $W^{(2)}(k, i_1, i_2)$, shown in FIG. 5, as converted using the equation (12).

FIG. 8 shows the contents of the respective elements of the two-dimensional array $W^{(2)}(k, i_1, i_2)$, shown in FIG. 7, using $x^{(2)}(k, i_1, i_2)$.

BEST MODE FOR CARRYING OUT THE INVENTION

Figure 9:
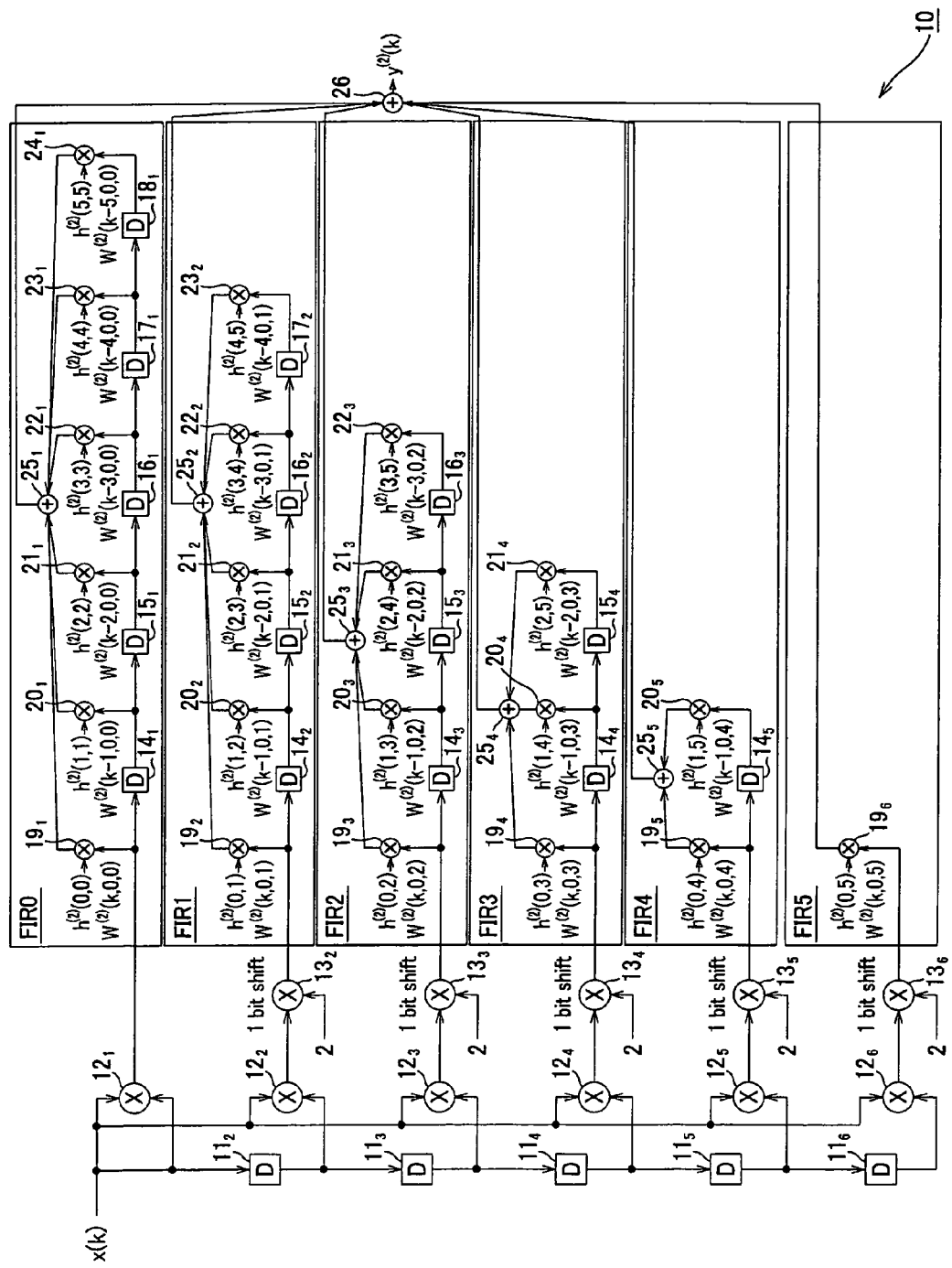
FIG. 9 illustrates an instance of a schematic structure of a signal processing apparatus embodying the present invention.

Before proceeding to explanation of an embodiment of the present invention, the technique of a Volterra filter, so far proposed and used for non-linear equalization of a signal, exhibiting non-linear distortion, will now be explained.

With a tap length of a linear section $M_1$ and with a tap length of a quadratic section $M_2$, a routine second-order Volterra filter is represented by the following equation (4):

$$y(k) = \sum_{i=0}^{M_1-1} h^{(1)}(i) \cdot x(k-i) + \sum_{i_1=0}^{M_2-1} \sum_{i_2=0}^{M_2-1} h^{(2)}(i_1, i_2) \cdot x(k-i_1) \cdot x(k-i_2) \quad (4)$$

where y(k) is an output signal of the second-order Volterra filter at time k, x(k) is an input signal to the second-order Volterra filter at time k, $h^{(1)}(i)$ is a tap coefficient of the linear section of the second-order Volterra filter ($i=0, 1, \ldots M_1-1$) and $h^{(2)}(i_1, i_2)$ is a tap coefficient of the quadratic section of the second-order Volterra filter ($i_1=0, 1, \ldots M_2-1$; $i_2=0, 1, \ldots M_2-1$).

For completing calculations for one cycle for the right side of the equation (4), $M_1$ times of multiplication operations and $2 \times M_2 \times M_2$ times of multiplication operations are needed for the first and quadratic terms of the right side, respectively. A number of delay lines equivalent to $M_2$ clocks are needed for holding the input signal x(k) for the quadratic section of the second-order filter in addition to the input signal delay line for the linear section of the second-order Volterra filter.

It is also known that, by exploiting known symmetry of the second-order Volterra filter, the aforementioned equation (4) can be simplified as indicated by the following equation (5):

$$y(k) = \sum_{i=0}^{M_1-1} h^{(1)}(i) \cdot x(k-i) + \sum_{i=0}^{M_2-1} h^{(2)}(i, i) \cdot x^2(k-i) + 2 \sum_{i_1=0}^{M_2-1} \sum_{i_2>i_1}^{M_2-1} h^{(2)}(i_1, i_2) \cdot x(k-i_1) \cdot x(k-i_2). \quad (5)$$

It is noted that $M_1$ times of multiplication operations, $2 \times M_2$ times of multiplication operations and $M_2 \times (M_2-1)$ times of multiplication operations are needed for the first, second and third terms of the right side of the equation (5), respectively.

However, notwithstanding the simplification by the equation (5), voluminous multiplication operations are needed for the quadratic section of the second-order Volterra filter, if $M_2$ is of a large value. Hence, the second-order Volterra filter is difficult to implement in consideration of costs.

Thus, in the present embodiment, calculations for the quadratic section of the second-order Volterra filter are simplified, as now explained, for reducing the volume of the multiplication operations as much as possible.

Meanwhile, the signal processing apparatus of the present embodiment equalizes an input signal, exhibiting non-linear distortion, by carrying out the calculations for the quadratic section of the second-order Volterra filter. The signal decoding apparatus of the present embodiment includes the above signal processing apparatus, as a non-linear adaptive equalizing filter, in addition to an equalizing filter, adapted for carrying out calculations for the linear section of the second-order Volterra filter, for equalizing and decoding signals recorded on the optical disc.

In the explanation to follow, the technique of simplifying the calculations for the quadratic section of the second-order Volterra filter is first explained. The configuration and the operation of a signal processing apparatus of the present embodiment, carrying out the simplified calculations, are explained next.

For simplifying the calculations of the quadratic section, substitution of the following equation (6):

$$x(k-i_1) \cdot x(k-i_2) = x^{(2)}(k, i_1, i_2) \quad (6)$$

is first made of the quadratic term of the input signal of the second-order Volterra filter.

From this equation (6), the relationship of the following equations (7) and (8):

$$x^{(2)}(k, i_1, i_2) = x^{(2)}(k, i_2, i_1) \quad (7)$$

$$x^{(2)}(k, i_1+m, i_2+m) = x(k-m-i_1) \cdot x(k-m-i_2) = x^{(2)}(k-m, i_1, i_2) \quad (8)$$

may be derived readily.

Moreover, using the equation (6), the above equation (4) may be rewritten as in the following equation (9):

$$y(k) = \sum_{i=0}^{M_1-1} h^{(1)}(i) \cdot x(k-i) + \sum_{i_1=0}^{M_2-1} \sum_{i_2=0}^{M_2-1} h^{(2)}(i_1, i_2) \cdot x^{(2)}(k, i_1, i_2). \quad (9)$$

The quadratic term of the equation (9) may be deemed to be a sum of multiplication outputs obtained by multiplication of corresponding elements $(i_1, i_2)$ of respective elements of a two-dimensional array $h^{(2)}(i_1, i_2)$ of quadratic tap coefficients, with the number of the elements of the two-dimensional array being $M_2 \times M_2$, with corresponding elements $(i_1, i_2)$ of respective elements of a two-dimensional array $x^{(2)}(k, i_1, i_2)$ of second-order signals, at given time k, with the number of the elements of the two-dimensional array $x^{(2)}(k, i_1, i_2)$ being $M_2 \times M_2$.

Now, let's take the case of $M_2=6$ as an example. FIG. 1 shows the concept of a two-dimensional array $x^{(2)}(k, i_1, i_2)$ of the second-order signals having 6×6 elements. FIG. 2 shows the concept of a two-dimensional array $h^{(2)}(i_1, i_2)$ of second-order tap coefficients having 6×6 elements. The tap coefficients $h^{(2)}(i_1, i_2)$ of the second-order filter may be fixed, or may be sequentially updated by any suitable adaptive equalization algorithm. The second term of the aforementioned equation (9) is obtained by multiplying the corresponding elements $(i_1, i_2)$ of FIGS. 1 and 2 with one another and by summing together the resulting products.

Using the equation (6), the aforementioned equation (5) may be rewritten as shown by the following equation (10):

$$y(k) = \sum_{i=0}^{M_1-1} h^{(1)}(i) \cdot x(k-i) + \sum_{i=0}^{M_2-1} h^{(2)}(i,i) \cdot x^{(2)}(k,i,i) + 2 \sum_{i_1=0}^{M_2-1} \sum_{i_2 > i_1}^{M_2-1} h^{(2)}(i_1, i_2) \cdot x^{(2)}(k, i_1, i_2) \quad (10)$$

FIG. 3 shows in which portions of the two-dimensional array of FIG. 1 are located the respective elements of the diagonal term $x^{(2)}(k, i, i)$ of the second-order signals contained in the quadratic term of the right side of the equation (10). As may be seen from FIG. 3, the respective elements of the diagonal term $x^{(2)}(k, i, i)$ are elements in the two-dimensional array with $i_1=i_2$, that is, diagonal elements. In similar manner, FIG. 4 shows in which portions of the two-dimensional array of FIG. 1 are located the respective elements of non-diagonal terms $x^{(2)}(k, i_1, i_2)$ contained in the third term of the right side of the equation (10). As may be seen from FIG. 4, the respective elements of the non-diagonal terms $x^{(2)}(k, i_1, i_2)$ are elements in the two-dimensional array with $i_1 < i_2$, that is, elements of an upper triangle excluding the diagonal elements.

A two-dimensional array $W^{(2)}(k, i_1, i_2)$ having 6×6 elements at a given time point k is defined by the following equation (11):

$$W^{(2)}(k, i_1, i_2) = \begin{cases} x^{(2)}(k, i_1, i_2), & i_1 = i_2, \\ 2x^{(2)}(k, i_1, i_2), & i_1 < i_2, \\ 0, & \text{else,} \end{cases} \quad (11)$$

In this case, for $W^{(2)}(k, i_1, i_2)$, the relationship of the following equation (12):

$$W^{(2)}(k, i_1+m, i_2+m) = W^{(2)}(k-m, i_1, i_2) \quad (12)$$

may readily be derived from the equation (8), for an optional integer m.

Using the equation (11), the aforementioned equation (10) may be expressed by the equation (13). The equation (14) expresses the equation (13) by the sum of the output of the linear section of the second-order Volterra filter shown by the equation (15) and the output of the quadratic section of the filter shown by the equation (16).

$$y(k) = \sum_{i=0}^{M_1-1} h^{(1)}(i) \cdot x(k-i) + \sum_{i_1=0}^{M_2-1} \sum_{i_2 \geq i_1}^{M_2-1} h^{(2)}(i_1, i_2) \cdot W^{(2)}x(k, i_1, i_2) \quad (13)$$

$$y(k) = y^{(1)}(k) + y^{(2)}(k) \quad (14)$$

$$y^{(1)}(k) = \sum_{i=0}^{M_1-1} h^{(1)}(i) \cdot x(k-i) \qquad (15)$$

$$y^{(2)}(k) = \sum_{i_1=0}^{M_2-1} \sum_{i_2 \geq i_1}^{M_2-1} h^{(2)}(i_1, i_2) \cdot W^{(2)} x(k, i_i, i_2). \qquad (16)$$

FIG. 5 shows respective elements of a two-dimensional array $W^{(2)}(k, i_1, i_2)$ contained in the term of the quadratic section of the equation (13). As shown in FIG. 5, $W^{(2)}(k, i_1, i_2)$ has zero values for components of a lower triangle excluding its diagonal elements. FIG. 6 shows, for comparison sake, a two-dimensional array in which the respective elements of FIG. 5 are represented using $x^{(2)}(k, i_1, i_2)$, as in the equation (11).

FIG. 7 shows a two-dimensional array obtained on converting respective elements of FIG. 5 using the equation (12). In this figure, $W^{(2)}(k-m, i_1, i_2)$ represents a signal obtained on delaying $W^{(2)}(k, i_1, i_2)$ by m clocks. For comparison, FIG. 8 shows a two-dimensional array obtained on expressing the respective elements of FIG. 7, using $x^{(2)}(k, i_1, i_2)$, as shown in the equation (11).

It is noted that the diagonal elements in FIG. 7 are $W^{(2)}(k, 0, 0)$, $W^{(2)}(k-1, 0, 0)$, ..., $W^{(2)}(k-5, 0, 0)$, which are equivalent to one-clock delayed versions of $W^{(2)}(k, 0, 0)$. Similarly, the elements parallel and neighboring to the diagonal elements are $W^{(2)}(k, 0, 1)$, $W^{(2)}(k-1, 0, 1)$, ..., $W^{(2)}(k-4, 0, 1)$, which are equivalent to one-clock delayed versions of $W^{(2)}(k, 0, 1)$. That is, in FIG. 7, the diagonal elements and the non-diagonal elements, which may be deemed to be plural one-dimensional arrays parallel to the diagonal elements, may be deemed to be outputs of the respective delay circuits in an FIR (Finite Impulse Response) filter. Moreover, the outputs of the respective delay elements form a quadratic section by taking products of these outputs with second-order tap coefficients $h^{(2)}(i_1, i_2)$ having corresponding indexes $(i_1, i_2)$ in the equations (12) and (13), and hence the portion of the quadratic section forming the diagonal elements of FIG. 7 and the portion of the quadratic section formed by the non-diagonal elements parallel to the diagonal elements may be deemed to form respective independent FIR filters.

FIG. 9 shows an instance of a circuit configuration of a signal processing apparatus which, in consideration of the aforementioned equations (6) and (11), is supplied as an input with x(k) at a time point k and outputs $W^{(2)}(k, i_1, i_2)$ in the equation (13). Referring to FIG. 9, the signal processing apparatus 10 is a parallel connection of six FIR filters (FIR0 to FIR5), each of which includes one or more multipliers and delay circuits. A delay circuit is provided between the FIR filters. Out of these filters, the first FIR filter, indicated by FIR0, outputs $W^{(2)}(k, 0, 0)$, $W^{(2)}(k-1, 0, 0)$, ..., $W^{(2)}(k-5, 0, 0)$, whilst the second FIR filter, indicated by FIR1 in FIG. 9, outputs $W^{(2)}(k, 0, 1)$, $W^{(2)}(k-1, 0, 1)$, ..., $W^{(2)}(k-5, 0, 1)$, which are the elements parallel and neighboring to the diagonal elements, and so forth.

In FIG. 9, input signals x(k) at time point k are multiplied with each other by a multiplier $12_1$ to output $W^{(2)}(k, 0, 0)(=x(k) \cdot x(k))$. Simultaneously, $W^{(2)}(k-1, 0, 0), \ldots W^{(2)}(k-5, 0, 0)$, which are signals delayed from the output signal by one clock each by delay circuits $14_1$, $15_1$, $16_1$, $17_1$ and $18_1$, respectively, are output from the delay circuits $14_1$, $15_1$, $16_1$, $17_1$ and $18_1$, respectively. The output from the multiplier $12_1$ and the outputs from the delay circuits $14_1$, $15_1$, $16_1$, $17_1$ and $18_1$ are multiplied by multipliers $19_1$, $20_1$, $21_1$, $22_1$, $23_1$ and $24_1$ with corresponding tap coefficients $h^2(0, 0)$, $h^2(1, 1)$, $h^2(2, 2)$, $h^2(3, 3)$, $h^2(4, 4)$ and $h^2(5, 5)$, and the resulting products are summed together by an adder $25_1$ to give an output of the filter FIR0.

A multiplier $12_2$ multiplies the input signal x(k) at time point k with the signal x(k−1), one clock before, delayed by a delay circuit $11_2$. A multiplier $13_2$ multiplies the resulting product with 2 to output $W^{(2)}(k, 0, 1)(=2x(k) \cdot x(k-1))$. Simultaneously, $W^{(2)}(k-1, 0, 1), \ldots, W^{(2)}(k-4, 0, 1)$, which are signals delayed each by one clock by the delay circuits $14_2$, $15_2$, $16_2$ and $17_2$, respectively, are output from the delay circuits $14_2$, $15_2$, $16_2$ and $17_2$, respectively. The output from the multiplier $12_2$ and the outputs from the delay circuits $14_2$, $15_2$, $16_2$ and $17_2$ are multiplied by multipliers $19_2$, $20_2$, $21_2$, $22_2$ and $23_2$ with corresponding tap coefficients $h^2(0, 1)$, $h^2(1, 2)$, $h^2(2, 3)$, $h^2(3, 4)$ and $h^2(4, 5)$, and the resulting products are summed together by an adder $25_2$ to give an output of the filter FIR1.

A multiplier $12_3$ multiplies the input signal x(k) at time point k with the signal x(k−2), two clocks before, delayed further by one clock by a delay circuit $11_3$. A multiplier $13_3$ multiplies the resulting product with 2 to output $W^{(2)}(k, 0, 2)(=2x(k) \cdot x(k-2))$. Simultaneously, $W^{(2)}(k-1, 0, 2), \ldots, W^{(2)}(k-3, 0, 2)$, which are signals delayed each by one clock by the delay circuits $14_3$, $15_3$ and $16_3$, respectively, are output from the delay circuits $14_3$, $15_3$ and $16_3$, respectively. The output from the multiplier $12_3$ and the outputs from the delay circuits $14_3$, $15_3$ and $16_3$ are multiplied by multipliers $19_3$, $20_3$, $21_3$ and $22_3$ with corresponding tap coefficients $h^2(0, 2)$, $h^2(1, 3)$, $h^2(2, 4)$ and $h^2(3, 5)$ and the resulting products are summed together by an adder $25_3$ to give an output of the filter FIR2.

A multiplier $12_4$ multiplies the input signal x(k) at time point k with the signal x(k−3), three clocks before, delayed further by one clock by a delay circuit $11_4$. A multiplier $13_4$ multiplies the resulting product with 2 to output $W^{(2)}(k, 0, 3)(=2x(k) \cdot x(k-3))$. Simultaneously, $W^{(2)}(k-1, 0, 3), \ldots, W^{(2)}(k-2, 0, 3)$, which are signals delayed each by one clock by the delay circuits $14_4$ and $15_4$, respectively, are output from the delay circuits $14_4$ and $15_4$, respectively. The output from the multiplier $12_4$ and the outputs from the delay circuits $14_4$ and $15_4$ are multiplied by multipliers $19_4$, $20_4$ and $21_4$, respectively, with corresponding tap coefficients $h^2(0, 3)$, $h^2(1, 4)$ and $h^2(2, 5)$, respectively, and the resulting products are summed together by an adder $25_4$ to give an output of the filter FIR3.

A multiplier $12_5$ multiplies the input signal x(k) at time point k with the signal x(k−4), four clocks before, delayed further by one clock by a delay circuit $11_5$. A multiplier $13_5$ multiplies the resulting product with 2 to output $W^{(2)}(k, 0, 4)(=2x(k) \cdot x(k-4))$. Simultaneously, $W^{(2)}(k-1, 0, 4)$, which is a signal delayed by one clock by the delay circuit $14_5$, is output from the delay circuits $14_5$. The output from the multiplier $12_5$ and the output from the delay circuits $14_5$ are multiplied by multipliers $19_5$ and $20_5$, respectively, with corresponding tap coefficients $h^2(0, 4)$ and $h^2(1, 5)$, respectively, and the resulting products are summed together by an adder $25_5$ to give an output of the filter FIR4.

A multiplier $12_6$ multiplies the input signal x(k) at time point k with the signal x(k−5), five clocks before, delayed further by one clock by a delay circuit $11_6$. A multiplier $13_6$ multiplies the resulting product with 2 to output $W^{(2)}(k, 0, 5)(=2x(k) \cdot x(k-5))$. In addition, a multiplier $20_6$ multiplies the output signal with a corresponding tap coefficient $h^2(0, 5)$, by a multiplier $19_6$, an output of which becomes an output of the FIR 5.

An ultimate output of the quadratic section of the second-order Volterra filter is expressed by a sum by an adder 26 of the outputs of the respective FIR filters FIR0 to FIR5.

It is noted that multiplication by 2 by the multipliers $13_2, \ldots, 13_6$ may be treated as being equivalent to 1-bit left shift in the calculations employing binary numbers in a digital circuit, so that it is unnecessary to provide dedicated multipliers. Consequently, as multipliers for the quadratic sections for $M_2=6$, only the multipliers $12_1, \ldots, 12_6, 19_1, \ldots, 19_6, 20_1, \ldots, 20_5, 21_1, \ldots, 21_4, 22_1, \ldots, 22_3, 23_1, 23_2$ and $24_1$, totaling at 27, are needed.

Figure 10:
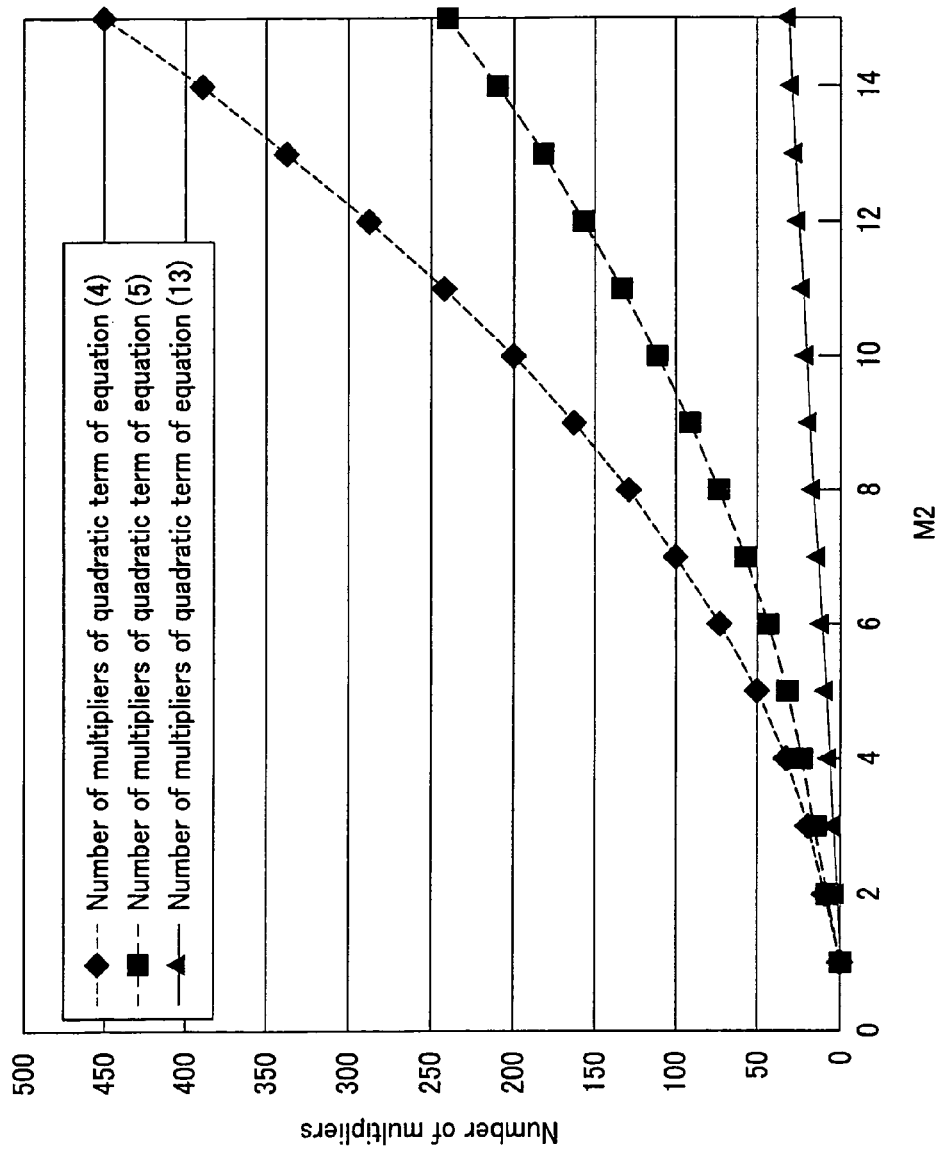
FIG. 10 illustrates another instance of a schematic structure of a signal processing apparatus embodying the present invention.

The numbers of the multipliers for the second-order portion of the second-order Volterra filter, shown in the equation (13), are shown in FIG. 10 and in the following Table 2 for various values of $M_2$. For comparison with the number of the multipliers for the conventional case, FIG. 10 and Table 2 also show the number of the multipliers of the quadratic section of the second-order Volterra filter as indicated by the equations (4) and (5).

TABLE 2

| M2 | Number of multipliers of quadratic term of equation (4) | Number of multipliers of quadratic term of equation (5) | Number of multipliers of quadratic term of equation (13) |
| --- | --- | --- | --- |
| 1 | 2 | 2 | 2 |
| 2 | 8 | 6 | 4 |
| 3 | 18 | 12 | 6 |
| 4 | 32 | 20 | 8 |
| 5 | 50 | 30 | 10 |
| 6 | 72 | 42 | 12 |
| 7 | 98 | 56 | 14 |
| 8 | 128 | 72 | 16 |
| 9 | 162 | 90 | 18 |
| 10 | 200 | 110 | 20 |
| 11 | 242 | 132 | 22 |
| 12 | 288 | 156 | 24 |
| 13 | 338 | 182 | 26 |
| 14 | 392 | 210 | 28 |
| 15 | 450 | 240 | 30 |

As may be seen from FIG. 10 and Table 2, it is possible, with the technique of the instant embodiment, to reduce the volume of multiplication operations appreciably, as compared to the case shown by the equation (4), by employing the conventional technique of reducing the calculations of the equation (5) simultaneously. Additionally, with the technique of the instant embodiment, the volume of multiplication operations may be reduced appreciably as compared to a case where the conventional technique for reducing the volume of calculation operations, shown in the equation (5), is used alone. The favorable effect achieved is outstanding for a larger value of $M_2$.

With the above-described signal processing apparatus 10, the configuration of FIG. 9 is used for outputting respective elements of the two-dimensional array shown in FIG. 8. However, since the configurations of the FRI filters are independent of one another, the number of the multipliers $19_1, \ldots, 19_6, 20_1, \ldots, 20_5, 21_1, \ldots, 21_4, 22_1, \ldots, 22_3, 23_1, 23_2$ and $24_1$, that is, the number of the tap lengths of the respective FIR filters FIR0 to FIR5, may be changed in case the equalization performance of the filters may be said to be optimum, for example, in case e.g. the data error rate exceeds a preset value. In similar manner, in case the filter equalization performance is sufficient, it is also possible to change the number of the FIR filters. However, the depth along the time axis proceeding from the diagonal term (FIR0) of the FIR filters (FIR0 to FIR5) towards the non-diagonal terms (FIR1 to FIR5) is thought to be a quantity relevant to the length of the inter-symbol interference (ISI) to be equalized, and hence the number of the FIR filters to be provided is desirably equal to or larger than the ISI length. This length of the ISI of PR is e.g. 3 for PR (111). In case the tap coefficient is to be updated by an optional adaptive equalization algorithm, it is also possible not to use the multipliers $13_2, \ldots, 13_6$. However, the configuration including the multipliers $13_2, \ldots, 13_6$ is desirable in consideration of the delay otherwise caused in the convergence of the tap coefficients of the quadratic section of the second-order filter. It is noted that, with the circuit configuration, shown in FIGS. 11 and 12, it is also possible to reduce the number of the multipliers responsible for 1-bit shift or not to provide these multipliers, as a matter of fact, without the risk of deteriorating the performance.

Figure 11:
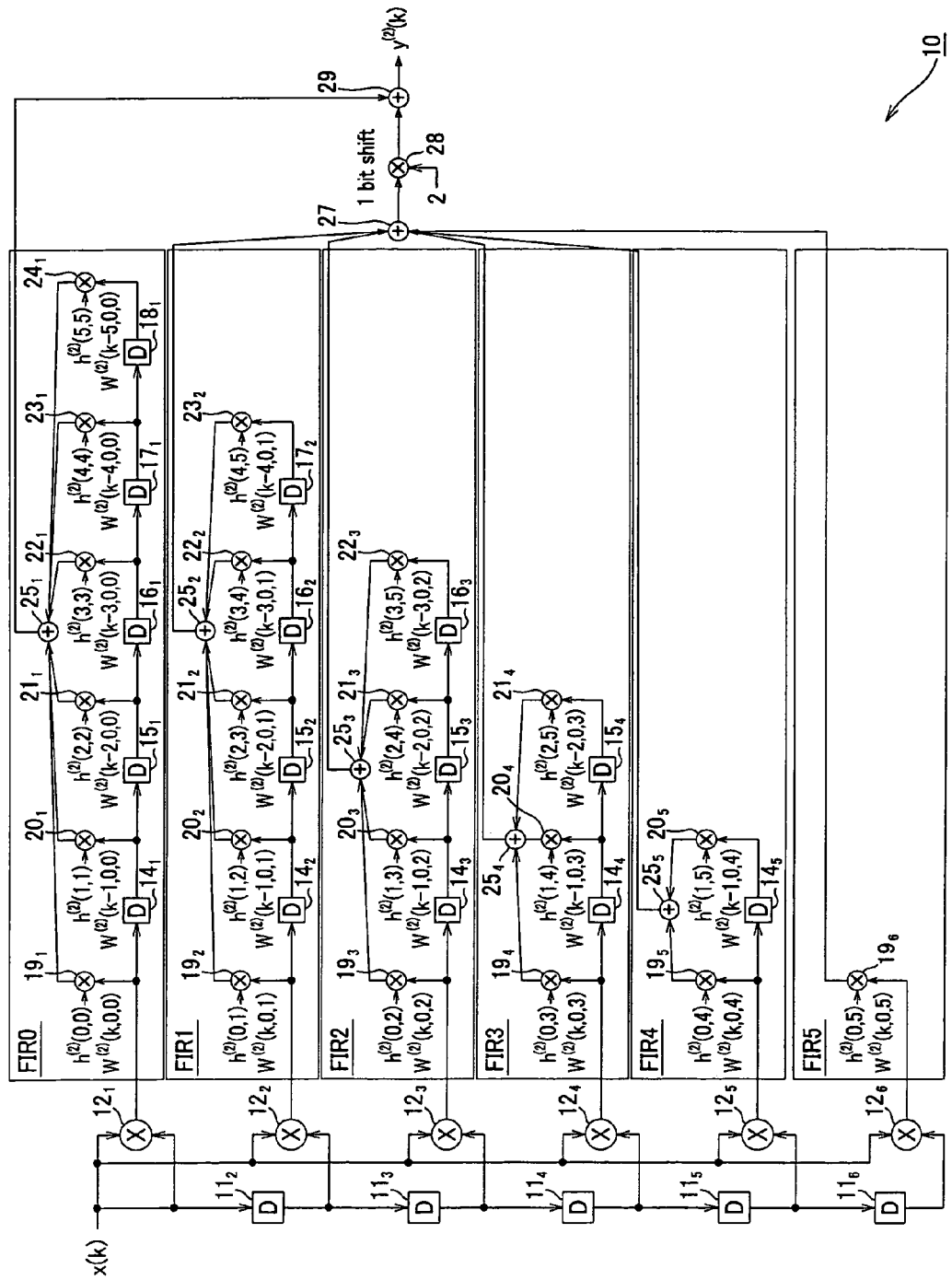
FIG. 11 illustrates yet another instance of a schematic structure of a signal processing apparatus embodying the present invention.

With the circuit configuration of the signal processing apparatus 10, shown in FIG. 11, the circuit configuration of FIG. 9 is further simplified from the circuit configuration of FIG. 9, while the volume of calculations is further reduced as compared to that with FIG. 9. More specifically, after the outputs FIR1 to FIR5 are summed together by the adder 27, the calculations to be performed by the multipliers $13_2, \ldots, 13_6$ are carried out by a multiplier 28, an output of which is summed by an adder 29 to the output of the adder $25_1$, whereby the number of bits needed in the filters FIR1 to FIR5 may be reduced, whilst the 1-bit shift operations for doubling calculations need to be carried out only once.

Figure 12:
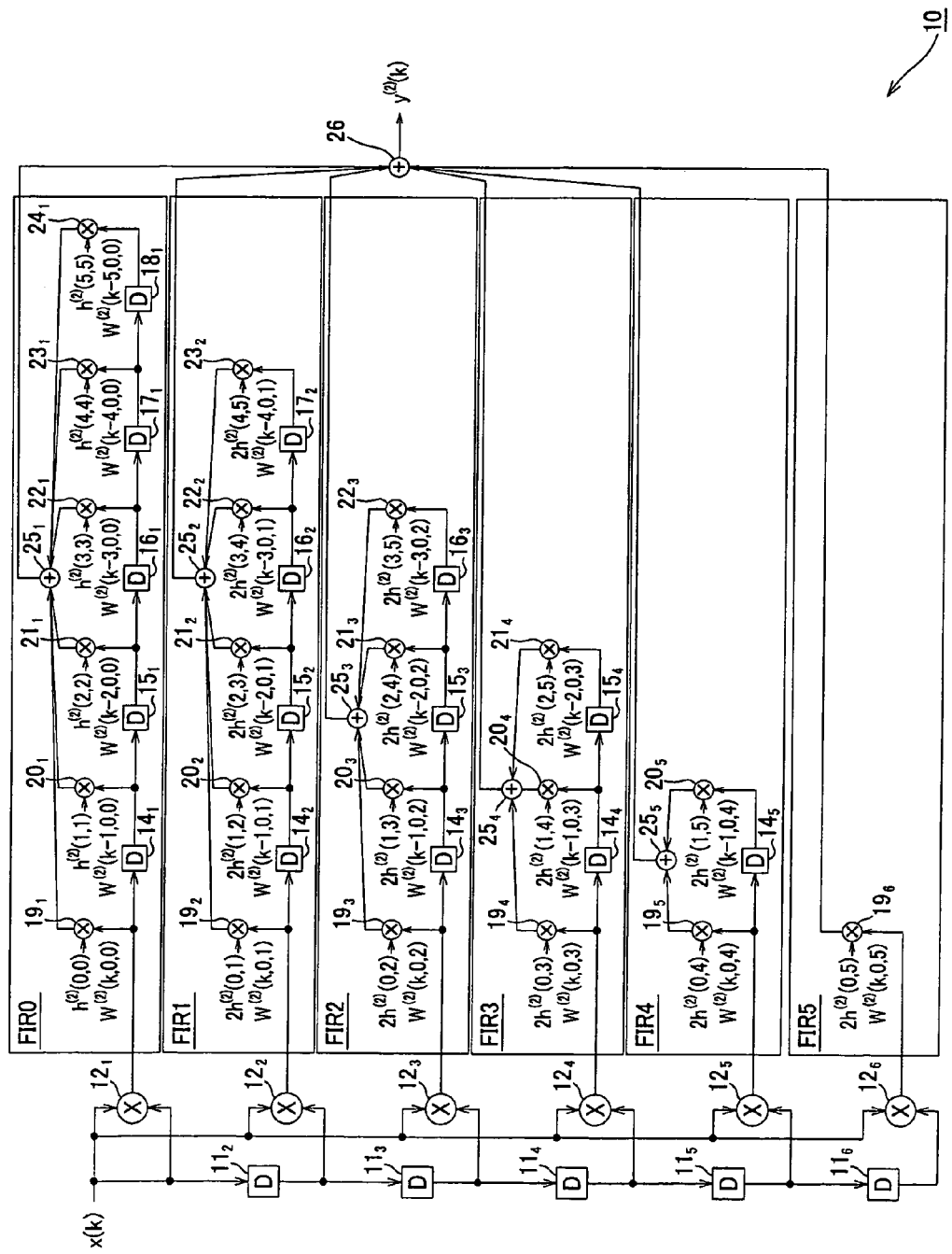
FIG. 12 shows the relation between the tap length of the quadratic section of the second-order Volterra filter embodying the present invention and the number of the multipliers needed therefor.

The coefficients for doubling, represented by this 1-bit shift calculation operation, may be incorporated into no other than the tap coefficients, by doubling the respective tap coefficients from the outset. In case of updating the tap coefficients using an adaptive equalization algorithm, doubling coefficients may be incorporated into no other than the tap coefficients or into a step gain parameter for updating the coefficients. In the latter case, if, with the step gain parameter of the diagonal term of $\mu_2$, the step gain parameter of the non-diagonal term is $2 \times \mu_2$, the doubling coefficients are unneeded and may be dispensed with in the respective FIR filters (FIR1 to FIR5), with the result that the multipliers $13_2, \ldots, 13_6$ of FIG. 9 are unnecessary, thus further simplifying the circuit configuration. FIG. 12 shows the circuit configuration for such case. In this case, the speed of updating the tap coefficients of the non-diagonal term is increased by a factor of two, which is equivalent to doubling the values of the tap coefficients of the non-diagonal terms.

With the above-described embodiment of the signal processing apparatus 10, the multiplication operations in non-linear equalization of an input signal having non-linear distortion may appreciably be reduced, with the result that the circuit scale in implementation by LSI (Large-Scale Integrated Circuit) may be reduced. In addition, the volume of calculations in implementation by a DSP (Digital Signal Processor) and software may be diminished.

Figure 13:
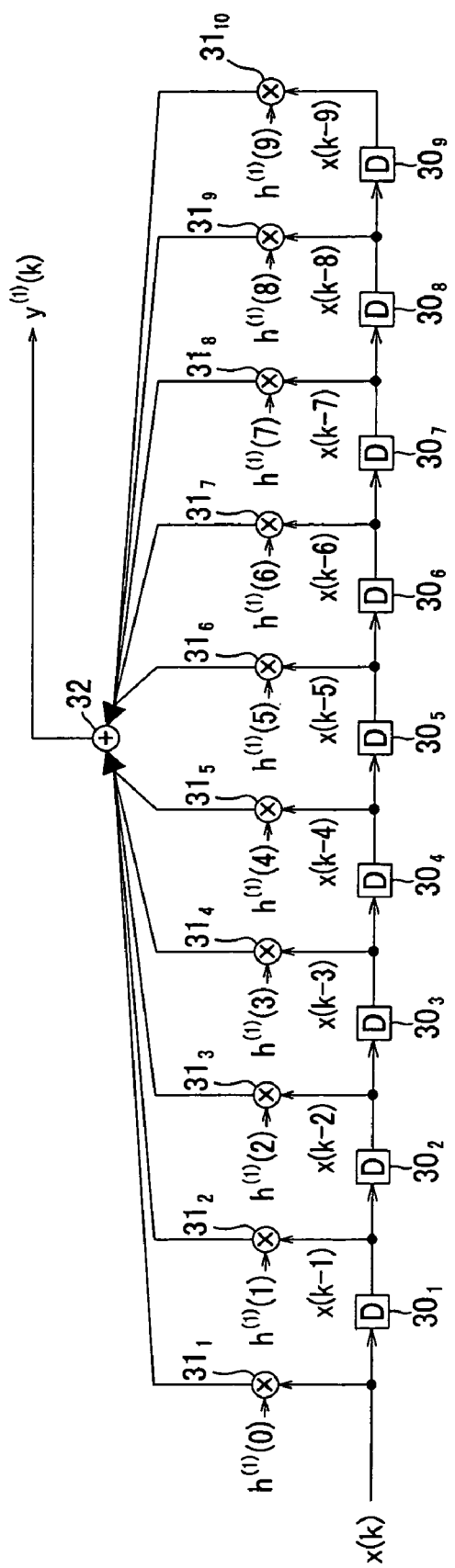
FIG. 13 shows an instance of a circuit structure of a linear section for $M_1=10$.

FIG. 13 shows an instance of a circuit configuration of a linear section of the second-order Volterra filter for $M_1=10$. The linear section of the second-order Volterra filter is made up by delay circuits $30_1, \ldots, 30_9$, configured for delaying the input signal x(k), multipliers $31_1, \ldots, 31_{10}$, configured for multiplying delayed signals x(k–1), ..., x(k–9), output from the delay circuits $30_1, \ldots, 30_9$, respectively, with preset filter coefficients, and an adder 32 for summing the outputs of the $31_1, \ldots, 31_{10}$. The tap coefficients $h^{(1)}(i)(i=0, 9)$ may be fixed tap coefficients or updated by any suitable equalization algorithm.

The configuration and the operation of a signal decoding apparatus 50 of the present invention, including the above-described signal processing apparatus 10 as a non-linear adaptive equalizer filter, will now be explained.

Figure 14:
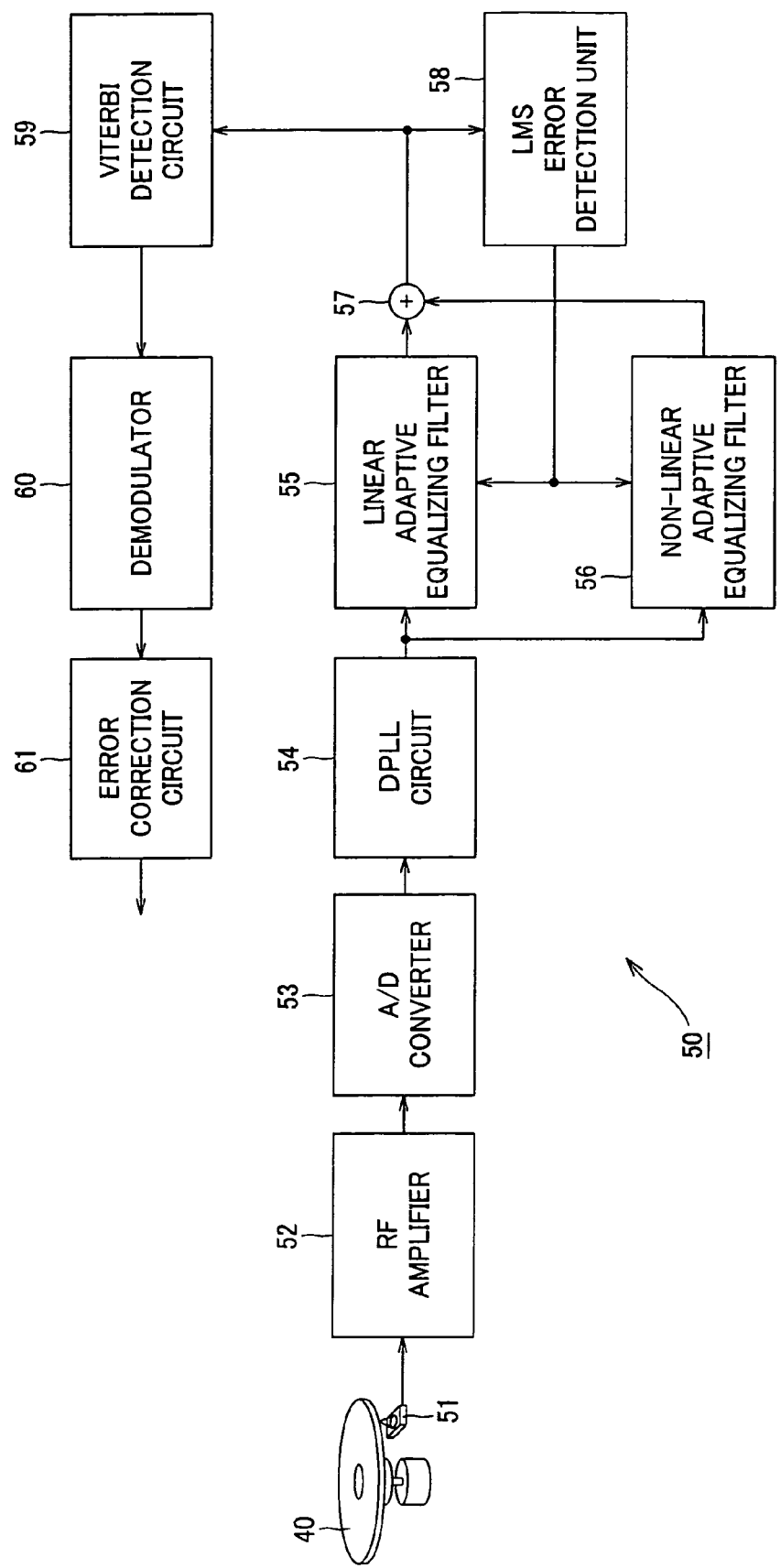
FIG. 14 illustrates a schematic structure of a signal decoding apparatus embodying the present invention.

For reproducing signals recorded on an optical disc 40, in the signal decoding apparatus 50, shown in FIG. 14, the laser light from a laser light source, provided in an optical head 51, is illuminated via optical system on the optical disc 40, and return light therefrom is received by a light receiving device, via an optical system provided in the optical head 51, so as to be subjected to photoelectric conversion. A signal from a light receiving element within the optical head 51 is amplified by an RF (Radio Frequency) amplifier 52 and quantized by an A/D (Analog/Digital) converter 53.

The quantized signal is sent to a DPLL (Digital Phase Locked Loop) circuit 54, which then outputs RF signals equivalent to those sampled with clocks synchronized by the DPLL. The output signal from the DPLL circuit 54 is subjected to adaptive equalizing processing by a linear adaptive equalizing filter 55 and a non-linear adaptive equalizing filter 56, output signals from which are summed together by an adder 57. A sum signal y(k) is sent to an LMS (Least Mean Square) error detection unit 58 and to a viterbi detection circuit 59. Meanwhile, the linear adaptive equalizing filter 55 performs calculations for the linear section of the second-order Volterra filter indicated by the equation (13). The non-linear adaptive equalizing filter 56 performs calculations for the quadratic section, and is configured as shown for example in and explained with reference to FIG. 9.

When the signal from the adder 57 is sent to the LMS error detection unit 58, an error signal from a target detection value conforming to a preset equalization system is detected and, based on the so detected error signal, the tap coefficients of the linear section and the quadratic section of the second-order Volterra filter are updated. The method for detecting an input code string within the LMS error detection unit 58 is arbitrary, such that the original code string is detected by a customary technique, such as, for example threshold value detection of FDTS (Fixed Delay Tree Search) or viterbi detection. Specifically, the LMS error detection unit 58 convolves the code string it has verified, with the PR coefficients desired to be equalized, to generate a provisional decision PR signal d(k), to detect an error signal e(k)(=d(k)−y(k)) between the target provisional decision PR signal d(k) at time k and the signal y(k) from the adder 57 at time k. The tap coefficient $h^{(1)}(k+1{:}i)$ at the next time point, that is, at a time point k+1, of the linear section of the filter, is updated in accordance with the following equation (17):

$$h^{(1)}(k+1{:}i)=h^{(1)}(k{:}i)+\mu_1 \cdot e(k) \cdot x(k-i) \qquad (17)$$

whilst the tap coefficient $h^{(2)}(k+1{:}i_1, i_2)$ at the next time point, that is, at a time point k+1, of the quadratic section of the second-order filter, is updated in accordance with the following equation (18):

$$h^{(2)}(k+1{:}i_1, i_2)=h^{(2)}(k{:}i_1, i_2)+\mu_2 \cdot e(k) \cdot x(k-i_1) \cdot x(k-i_2) \qquad (18)$$

In these equations (17), (18), $\mu_1$ and $\mu_2$, denote step gain parameters of the LMS algorithm. The updated tap coefficients are sent to the linear adaptive equalizing filter 55 and to the non-linear adaptive equalizing filter 56.

The signal from the adder 57 is decoded based on the viterbi algorithm, by a viterbi decoding circuit 59, and processed by a demodulating circuit 60 with demodulation which is the reverse of the modulation used in recording. The replay data, resulting from demodulation, is sent to an error detection circuit 61 for error correction.

The concrete results of signal equalization are shown in FIGS. 15 and 16. FIG. 15 shows an instance where equalization has been executed solely by the linear adaptive equalizing filter 55, and FIG. 16 shows an instance where equalization has been executed by both the linear adaptive equalizing filter 55 and the non-linear adaptive equalizing filter 56. In both of these instances, the system for equalization used is PR(111). In the present embodiment, optical disc replay signals are generated by numerical value calculation simulation on a computer, in the signal decoding apparatus 50 of FIG. 14, and sampled by a program equivalent to an A/D converter. A digital section of FIG. 14 is formed by a signal processing program. A 15% asymmetry is produced in a simulation waveform.

An eye pattern, obtained on interpolating pre-equalization digital data, output from the DPLL circuit 54 of FIG. 14, with a SINC function, as an interpolation function satisfying the sampling theorem for digital signal processing, and another eye pattern, obtained on interpolating digital data, obtained in turn on linear/non-linear adaptive equalizing the output of the adder 57, with the above SINC function, will now be shown and explained.

Figure 15A:
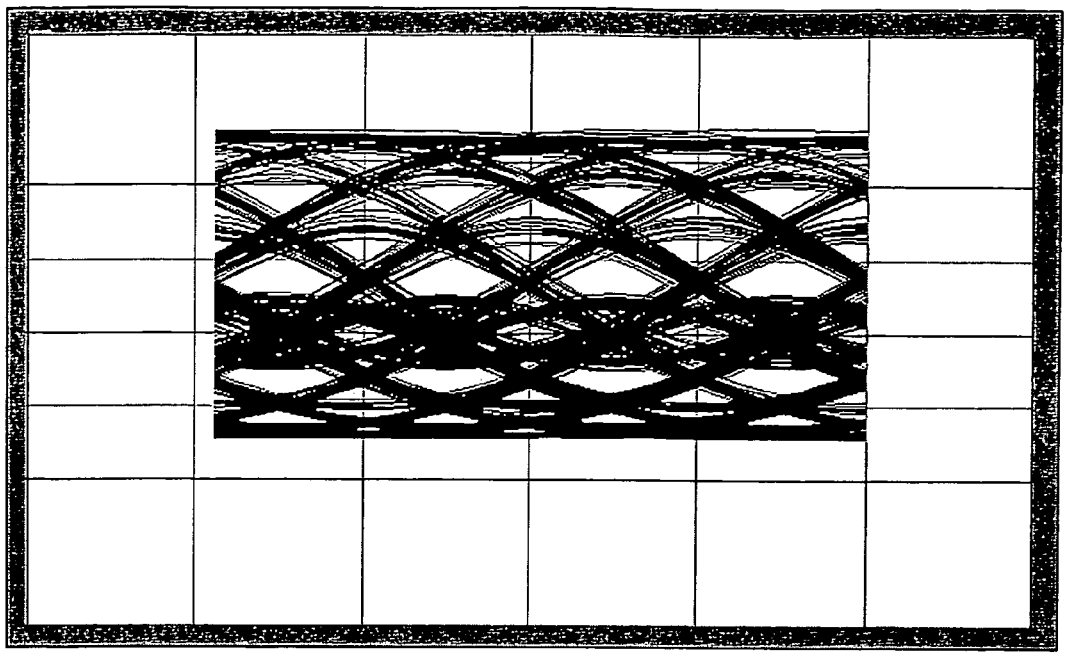
FIG. 15 shows an eye pattern in case an input signal exhibiting non-linear distortion is equalized only with a linear adaptive equalizing filter.
Figure 15B:
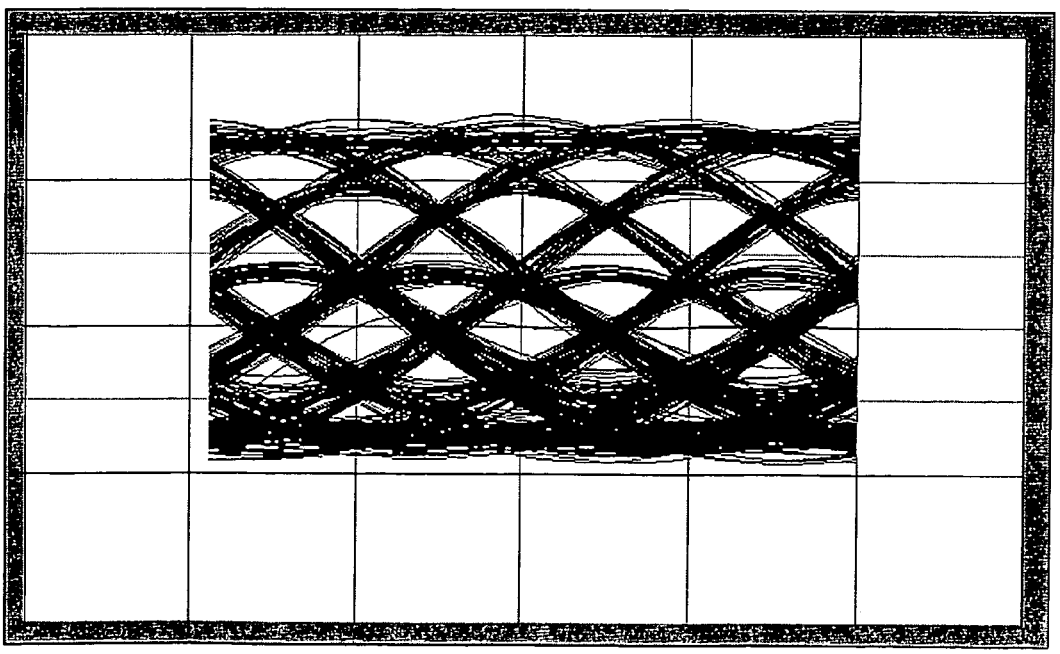
Figure 16A:
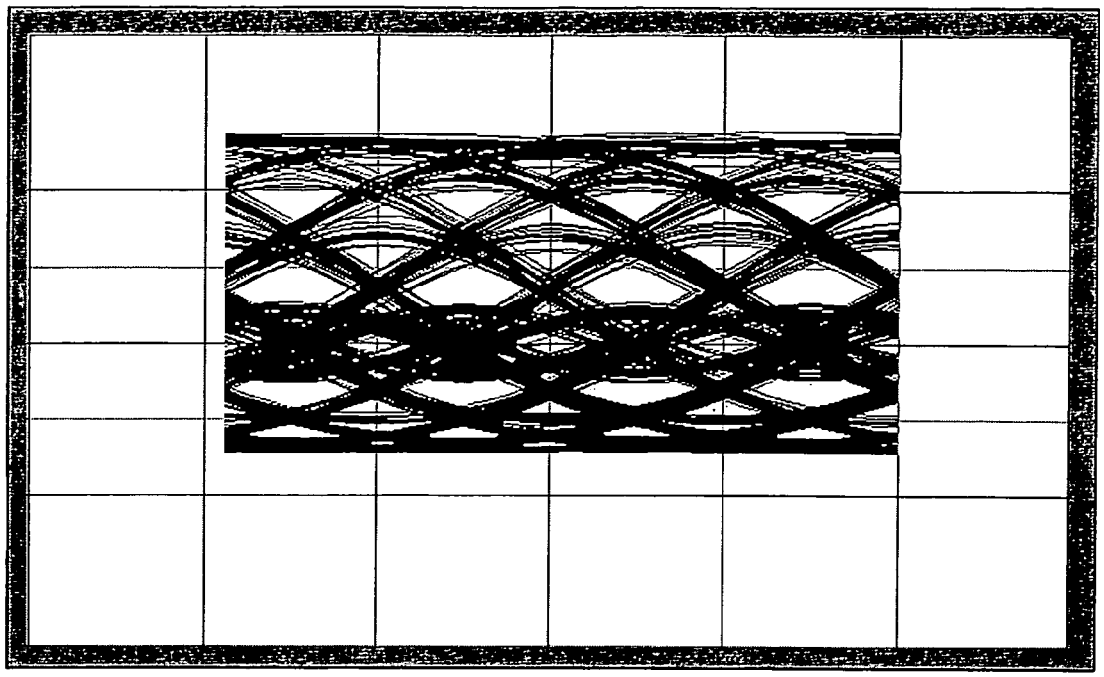
FIG. 16 shows an eye pattern in case an input signal exhibiting non-linear distortion is equalized with a linear adaptive equalizing filter and a non-linear adaptive equalizing filter.
Figure 16B:
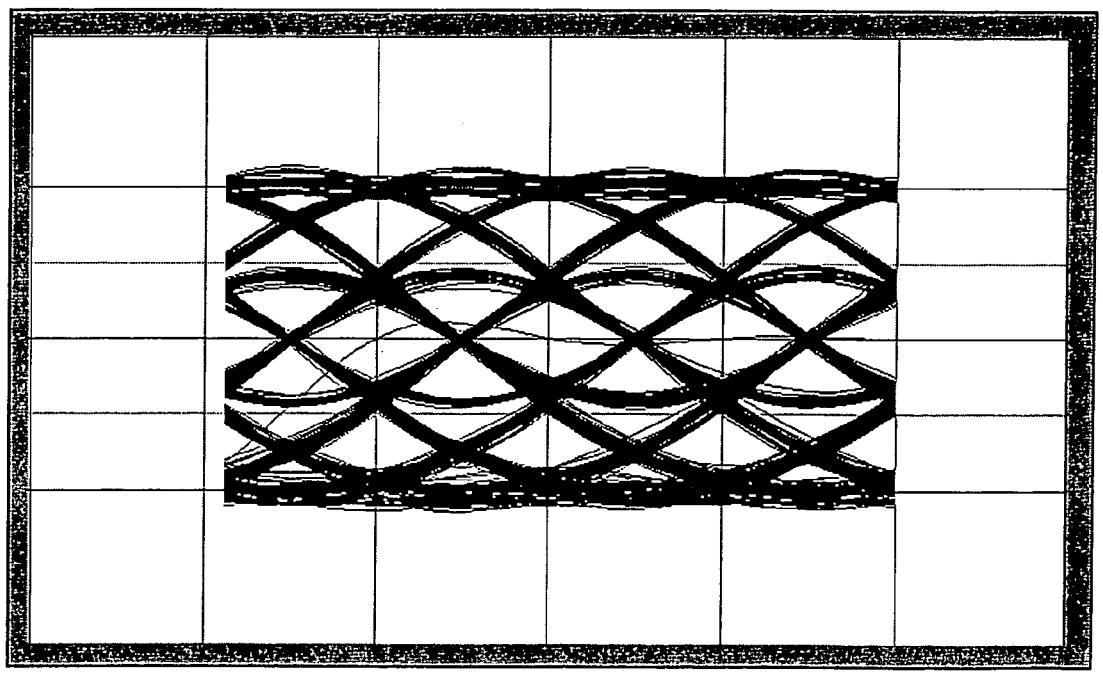
Figure 17:
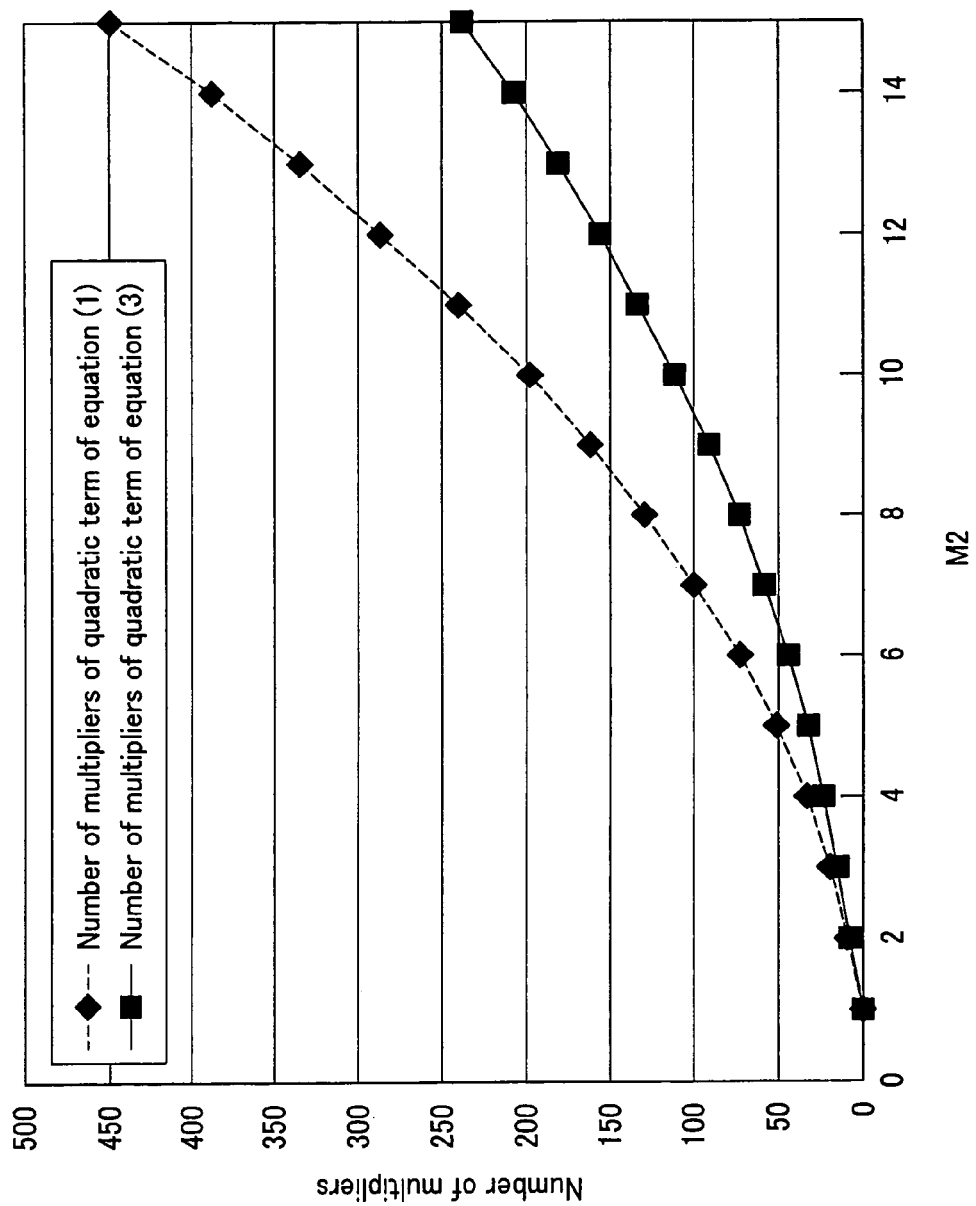
FIG. 17 shows the relation between the tap length of a quadratic section of a conventional second-order Volterra filter and the number of multipliers needed therefor.

In case only the linear adaptive equalizing filter 55 is used, non-linear characteristics generated in the pre-equalization waveform, that is, 15% asymmetry, are left over as non-linear equalization error, even after equalization, and the lower eyes remain collapsed, as may be apparent on comparison of the output of the DPLL circuit 54 shown in FIG. 15(A), that is, the pre-equalization eye pattern, to the output of the DPLL circuit 54 shown in FIG. 15(B), that is, the post-equalization eye pattern. On the other hand, with use of both the linear adaptive equalizing filter 55 and the non-linear adaptive equalizing filter 56, the non-linear characteristics, produced in the pre-equalization waveform by the 15% asymmetry, are partially improved by the efficacy of the non-linear adaptive equalization filter, and eye patterns symmetrical in the up-and-down direction are produced, as may be apparent from comparison of the output of the DPLL circuit 54, that is, the pre-equalization eye pattern, shown in FIG. 16(A), to the post-equalization eye pattern, shown in FIG. 16(B).

Thus, with the signal decoding apparatus 50 of the present invention, the non-linear distortion may effectively be corrected in reproducing signals recorded on the optical disc 40, by providing the non-linear adaptive equalizing filter 56, equivalent to the above-described signal processing apparatus 10, in addition to the linear adaptive equalizing filter 55, configured to perform the conventional linear adaptive equalization. In particular, the present non-linear adaptive equalizing filter 56 is ready to implement because the volume of the multiplication calculations needed may be appreciably smaller than conventionally.

The present invention is not limited to the above-described embodiments explained with reference to the drawings and, as may be apparent to those skilled in the art, a large variety of changes, substitutions or equivalents may be attempted without departing from the scope of the invention as defined in the claims.

The invention claimed is:

1. A signal processing apparatus, comprising:
    a second-order Volterra filter configured to equalize an input signal, wherein,
    a quadratic section of said second-order Volterra filter configured to implement a quadratic term of said second-order Volterra filter includes a plurality of multiplication units configured to multiply a first input signal with a second input signal to produce a product signal, one of said plurality of multiplication units being configured to employ a signal not delayed from said first input signal, as said second input signal, a remaining one of said plurality of multiplication units being configured to employ a signal delayed a preset time from said first input signal, as said second input signal, the one of said plurality of multiplication units including,
one or more delay units connected in series with one another and configured to delay a signal output from the one of said plurality of multiplication units, each by a unit time,
a multiplier configured to multiply the signal output from the one of said plurality of multiplication units and a signal output from each of said one or more delay units, each with a preset coefficient, and
an adder configured to sum outputs of said multiplier together,
wherein a step gain parameter for updating each preset coefficient of a multiplier of the remaining one of said plurality of multiplication units is twice a step gain parameter for updating each preset coefficient of the multiplier of the one of said plurality of multiplication units.

2. The signal processing apparatus according to claim 1, wherein said plurality of multiplication units includes n of said multiplication units, n being an integer not less than 1, a kth one of said plurality of multiplication units, k being an integer such that $1 \leq k \leq n$, being configured to employ a signal corresponding to said first input signal delayed by (k−1) times of said unit time as said second input signal.

3. A signal processing method, employing a second-order Volterra filter, for equalizing an input signal, the signal processing method comprising:
performing a processing equivalent to a quadratic term of said second-order Volterra filter including,
multiplying a first signal with a signal not delayed from said first signal to produce a first product signal;
multiplying the first signal with a signal delayed a preset time from said first signal to produce a second product signal:
delaying the first product signal, by one or more series-connected delay units, each by a unit time;
multiplying the first product signal and a signal output from each of said one or more series-connected delay units, each with a preset coefficient to produce a plurality of addend signals,
multiplying the second product signal with a preset coefficient to produce an addend signal, and
summing the addend signal and the plurality of addend signals together,
wherein a step gain parameter for updating the preset coefficient for multiplying the second product signal is twice a step gain parameter for updating each preset coefficient for multiplying the first product signal and the signal output from each of said one or more series-connected delay units.

4. A signal decoding apparatus, employing a second-order Volterra filter, for equalizing and decoding an input signal, the signal decoding apparatus comprising:
a linear section of the second-order Volterra filter, the linear section being configured to implement a linear term of said second-order Volterra filter and to linearly equalize said input signal;
a quadratic section of the second-order Volterra filter, the quadratic section being configured to implement a quadratic term of said second-order Volterra filter and to non-linearly equalize said input signal;
a first adder configured to sum a signal output from said linear section and a signal output from said quadratic section together; and
a processor configured to execute most likelihood decoding for a signal output from said first adder, wherein
said quadratic section includes a plurality of multiplication units configured to multiply a first input signal and a second input signal together, one of said plurality of multiplication units being configured to employ a signal not delayed from said first input signal, as said second input signal, a remaining one of said plurality of multiplication units being configured to employ a signal delayed a preset time from said first input signal, as said second input signal, the one of said plurality of multiplication units including,
one or more series-connected delaying units configured to delay signals output from the one of said plurality of multiplication units each by a preset unit time,
a multiplier configured to multiply a signal output from the one of said plurality of multiplication units and a signal output from each of said one or more series-connected delaying units, each with a preset coefficient, and
a second adder configured to sum outputs of said multiplier together,
wherein a step gain parameter for updating each preset coefficient of a multiplier of the remaining one of said plurality of multiplication units is twice a step gain parameter for updating each preset coefficient of the multiplier of the one of said plurality of multiplication units.

5. The signal decoding apparatus according to claim 4, wherein said plurality of multiplication units includes n of said multiplication units, n being an integer not less than 1, a kth one of said plurality of multiplication units, k being an integer such that $1 \leq k \leq n$, being configured to employ a signal corresponding to said first input signal delayed by (k−1) times of said preset unit time, as said second input signal.

6. The signal decoding apparatus according to claim 4, wherein the processor is further configured to detect an error between a signal at each discrete time output from said first adder and a target signal, said multiplier updating a preset coefficient every discrete time based on an error detected by said processor.

7. A signal decoding method employing a second-order Volterra filter in equalizing and decoding an input signal, the signal decoding method comprising:
performing a processing equivalent to a linear term of said second-order Volterra filter and linearly equalizing said input signal;
performing a processing equivalent to a quadratic term of said second-order Volterra filter and non-linearly equalizing said input signal;
summing a signal output from said performing the processing equivalent to the linear term and a signal output from said performing the processing equivalent to the quadratic term together; and
most likelihood decoding a signal output from said summing, wherein
said performing the processing equivalent to the quadratic term includes,
multiplying a first input signal with a signal not delayed from said first input signal to produce a first product signal;
multiplying the first input signal with a signal delayed a preset time from said first input signal to produce a second product signal;

delaying the first product signal, by one or more series-connected delay units, each by a unit time;

multiplying the first product signal and a signal output from each of said one or more series-connected delay units, each with a preset coefficient to produce a plurality of addend signals;

multiplying the second product signal with a preset coefficient to produce an addend signal; and summing the addend signal and the plurality of addend signals together, wherein a step gain parameter for updating the preset coefficient for multiplying the second product signal is twice a step gain parameter for updating each preset coefficient for multiplying the first product signal and the signal output from each of said one or more series-connected delay units.

8. A signal processing apparatus, comprising:

a second-order Volterra filter configured to equalize an input signal, wherein, a quadratic section of said second-order Volterra filter configured to implement a quadratic term of said second-order Volterra filter includes a plurality of multiplication units configured to multiply a first input signal with a second input signal to produce a product signal, one of said plurality of multiplication units being configured to employ a signal not delayed from said first input signal, as said second input signal, a remaining one of said plurality of multiplication units being configured to employ a signal delayed a preset time from said first input signal, as said second input signal, the one of said plurality of multiplication units including, one or more delay units connected in series with one another and configured to delay a signal output from the one of said plurality of multiplication units, each by a unit time, a multiplier configured to multiply the signal output from the one of said plurality of multiplication units and a signal output from each of said one or more delay units, each with a preset coefficient, and an adder configured to sum outputs of said multiplier together, the remaining one of said plurality of multiplication units including, a shifter configured to left-shift the product signal to produce the signal output from the remaining one of said plurality of multiplication units, and a multiplier configured to multiply the signal output from the remaining one of said plurality of multiplication units with a preset coefficient.

9. A signal processing apparatus, comprising:

a second-order Volterra filter configured to equalize an input signal, wherein a quadratic section of said second-order Volterra filter configured to implement a quadratic term of said second-order Volterra filter includes, a plurality of multiplication units configured to multiply a first input signal with a second input signal to produce a product signal, one of said plurality of multiplication units being configured to employ a signal not delayed from said first input signal, as said second input signal, the remaining ones of said plurality of multiplication units each being configured to employ a signal delayed a preset time from said first input signal, as said second input signal, the one of said plurality of multiplication units and one of the remaining ones of said plurality of multiplication units each including, one or more delay units connected in series with one another and configured to delay a signal output from a respective of the one of said plurality of multiplication units and the one of the remaining ones of said plurality of multiplication units, each by a unit time, a multiplier configured to multiply the signal output from the respective of the one of said plurality of multiplication units and the one of the remaining ones of said plurality of multiplication units, and a signal output from each of said one or more delay units, each with a preset coefficient, and an adder configured to sum outputs of said multiplier together;

a first adding unit configured to add an output from the adder of the one of the remaining ones of said plurality of multiplication units with an output from another of the remaining ones of said plurality of multiplication units to produce a summed signal;

a shifter configured to left-shift the summed signal to produce a shifted signal; and a second adding unit configured to add the shifted signal and an output from the adder of the one of said plurality of multiplication units.

* * * * *